United States Patent
Mitsui (10) Patent No.: US 8,662,753 B2
(45) Date of Patent: Mar. 4, 2014

(54) SLIDE DEVICE FOR ELECTRONIC DEVICE

(75) Inventor: Yasuhiro Mitsui, Ichihara (JP)

(73) Assignee: Mitsubishi Steel MFG. Co., Ltd., Tokyo (JP)

( * ) Notice: Subject to any disclaimer, the term of this patent is extended or adjusted under 35 U.S.C. 154(b) by 0 days.

(21) Appl. No.: 13/703,094

(22) PCT Filed: Jun. 13, 2011

(86) PCT No.: PCT/JP2011/063502
§ 371 (c)(1),
(2), (4) Date: Dec. 10, 2012

(87) PCT Pub. No.: WO2011/158788
PCT Pub. Date: Dec. 22, 2011

(65) Prior Publication Data
US 2013/0077902 A1 Mar. 28, 2013

(30) Foreign Application Priority Data

Jun. 15, 2010 (JP) ................ 2010-136343

(51) Int. Cl.
*F16C 29/00* (2006.01)
(52) U.S. Cl.
USPC ............................... 384/26; 384/35
(58) Field of Classification Search
USPC ................. 384/7, 21, 22, 26, 35, 41, 42, 20; 455/575.5
See application file for complete search history.

(56) References Cited

U.S. PATENT DOCUMENTS

| 4,549,773 | A | * | 10/1985 | Papp et al. | 384/18 |
| 7,395,102 | B2 | * | 7/2008 | Park et al. | 455/575.4 |
| 7,761,124 | B2 | * | 7/2010 | Huang et al. | 455/575.4 |
| 7,809,415 | B2 | * | 10/2010 | Horng | 455/575.4 |

(Continued)

FOREIGN PATENT DOCUMENTS

| JP | 2003-319044 | 11/2003 |
| JP | 2004-350118 | 12/2004 |
| JP | 2005-142728 | 6/2005 |
| JP | 2008-113067 | 5/2008 |

OTHER PUBLICATIONS

International Search Report mailed on Aug. 2, 2011.

*Primary Examiner* — Phillip A Johnson
(74) *Attorney, Agent, or Firm* — IPUSA, PLLC (57) ABSTRACT

A slide device for an electronic device includes a substrate including a substrate including a pair of side edges; an intermediate plate including a pair of sandwiching portions slidably sandwiching the pair of side edges in the front and back direction, respectively, and a pair of outer edges at outer sides of the side edges in the width direction, respectively; a slide plate including a pair of outer sandwiching portions slidably sandwiching the pair of outer edges in the front and back direction, respectively; an intermediate housing position defining portion that protrudes an outer side in the width direction from the front end portion of the outer edge for defining an intermediate housing position of the slide plate with respect to the intermediate plate; an intermediate using position defining portion that protrudes the outer side in the width direction from the back end portion of the outer edge for defining an intermediate using position of the slide plate with respect to the intermediate plate; a housing position defining portion that protrudes in an upper direction of an upper and lower direction at a front portion of the substrate for defining a housing position of the intermediate plate with respect to the substrate; and a using position defining portion that protrudes in the upper direction at a back portion of the substrate for defining a using position of the intermediate plate with respect to the substrate.

7 Claims, 11 Drawing Sheets

(56) References Cited

U.S. PATENT DOCUMENTS

| | | | |
|---|---|---|---|
| 8,260,383 B2 * | 9/2012 | Yuan | 455/575.4 |
| 8,265,721 B2 * | 9/2012 | Amano | 455/575.4 |
| 2003/0202656 A1 | 10/2003 | Ikeuchi et al. | |
| 2009/0069059 A1 * | 3/2009 | Min et al. | 455/575.4 |
| 2009/0149228 A1 * | 6/2009 | Wang et al. | 455/575.4 |
| 2009/0149229 A1 * | 6/2009 | Li et al. | 455/575.4 |

\* cited by examiner

SLIDE DEVICE FOR ELECTRONIC DEVICE

TECHNICAL FIELD

The present invention relates to a slide device for an electronic device including a body portion and a sub-body portion capable of sliding the sub-body portion with respect to the body portion. The present invention specifically relates to a slide device for an electronic device used for an electronic device such as a mobile phone, a mobile terminal or the like.

BACKGROUND ART

Regarding an electronic device that structures a mobile phone or a mobile terminal, such a device can include a body portion including a numeric keypad (or a ten key), a microphone or the like, a sub-body portion including a liquid crystal display or a speaker, and a slide device for an electronic device that slides the sub-body portion with respect to the body portion is known.

Among such electronic devices, the mobile phone is configured such that the speaker is positioned at an ear of a user and the microphone is positioned in the vicinity of a mouth or a jaw of the user by sliding the sub-body portion which is connected to the body portion via the slide device for an electronic device with respect to the body portion. Further, the mobile terminal is configured such that the numeric keypad is housed when the numeric keypad is not used and the numeric keypad is positioned in front of the liquid crystal display when the numeric keypad is used.

Patent Document 1 discloses such a kind of electronic device. The slide device for an electronic device shown in Patent Document 1 slidably connects a slide plate fixed to a sub-body portion to a substrate of a body portion by including a guide and a rail. The slide plate is connected to the substrate via a spring, and with this, an opposing force against an operation by a user is applied in a first half of the sliding operation and an assistance force to the operation by the user is applied in a latter half of the sliding operation, in an opening direction.

RELATED ART

Patent Document

[Patent Document 1] Japanese Laid-open Patent Publication No. 2008-113067

SUMMARY OF THE INVENTION

Problems to be Solved by the Invention

With the slide device for an electronic device having such a structure, a problem can occur. Specifically, this problem can occur when sliding a sub-body portion with respect to a body portion in a vertical direction for the case provided that the whole shape is a rectangular shape where the length in a horizontal direction is longer in a plane view and is configured to be slid in a vertical direction.

It is required that an overlapped amount of the sub-body portion and the body portion in the sliding direction is as small as possible, so that an exposed surface of the body portion in accordance with the sliding of the sub-body portion in an opening direction becomes as large as possible in an extended status where the sub-body portion is slid with respect to the body portion. Especially, when an input device such as a numeric keypad, a keyboard or the like is attached to the body portion, it is largely required that the exposed surface becomes as large as possible in the light of a convenience for users.

However, in thin extended status, it is necessary to ensure a stability of the sub-body portion when the user is operating, and also ensure a suitable hardness of the parts related to the sliding operation, including at least the guide and the rail. Thus, it is required that the overlapped amount of the guide and the rail becomes longer. This results in the fact that the overlapped amount of the sub-body portion and the body portion becomes larger to a certain extent.

This means that it is limited to ensure a larger area of the exposed surface of the body portion facing the user in the extended status. In other words, there is a problem that it is not easy to increase salability of the device by ensuring the convenience for users by ensuring the exposed area of the body portion to a desired area and ensuring operativity by ensuring the stability of the sub-body portion at the same time.

The present invention is made in light of the above problems, and may provide a slide device for an electronic device with a high salability by compatibly combining convenience and operativity.

Means to Solve the Problems

In order to solve the above problems, there is provided a slide device for an electronic device including a substrate including a substrate including a pair of side edges; an intermediate plate including a pair of sandwiching portions slidably sandwiching the pair of side edges in the front and back direction, respectively, and a pair of outer edges at outer sides of the side edges in the width direction, respectively; a slide plate including a pair of outer sandwiching portions slidably sandwiching the pair of outer edges in the front and back direction, respectively; an intermediate housing position defining portion that protrudes an outer side in the width direction from the front end portion of the outer edge for defining an intermediate housing position of the slide plate with respect to the intermediate plate; an intermediate using position defining portion that protrudes the outer side in the width direction from the back end portion of the outer edge for defining an intermediate using position of the slide plate with respect to the intermediate plate; a housing position defining portion that protrudes in an upper direction of an upper and lower direction at a front portion of the substrate for defining a housing position of the intermediate plate with respect to the substrate; and a using position defining portion that protrudes in the upper direction at a back portion of the substrate for defining a using position of the intermediate plate with respect to the substrate.

Effect of the Invention

According to the slide device for an electronic device of the invention, a high salability can be obtained by compatibly combining convenience and operativity.

EMBODIMENT

Embodiments of the present invention will be described below with reference to drawings.

In FIG. 1 to FIG. 11, which illustrate the embodiments of the invention, "F" indicates a front direction of a front and back direction, "U" indicates an upper direction of an upper and lower direction, and "R" indicates a right direction of a width direction.

Figure 1:
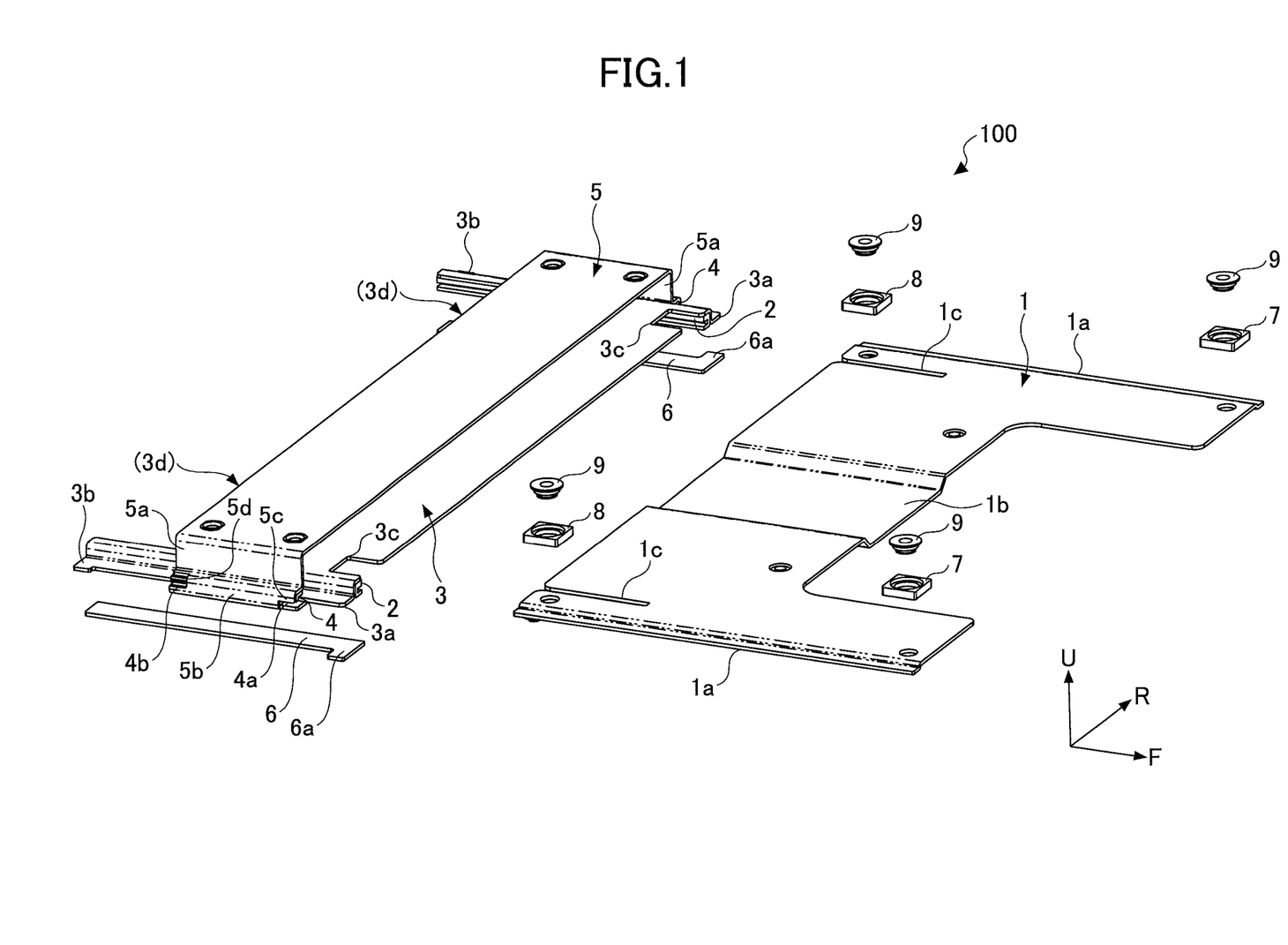
FIG. 1 is a schematic view showing main components of a slide device for an electronic device of an embodiment of the invention in an exploded state.

As shown in FIG. 1, a slide device for an electronic device 100 of the embodiment includes a base plate 1 (substrate) and a slide plate 3 (intermediate plate). The base plate 1 includes a left-and-right pair (symmetrical pair) of rails 1a (side edges) extending in the front and back direction to be apart from each other in the width direction. The slide plate 3 includes a left-and-right pair of guides 2 (sandwiching portions) slidably sandwiching the left-and-right pair of rails 1a in the front and back direction and a pair of outer rails 3a (outer edges) at outer sides of the rails 1a in the width direction, respectively.

The base plate 1 is structured by pressing and bending a metal plate material. The base plate 1 is provided with a concave portion 1b in the vicinity of the center in the width direction that concaves toward a lower direction. Each of the rails 1a is formed by first perpendicularly bending a portion that positions the outer side of the concave portion 1b in the width direction toward the lower direction to direct toward the lower direction for an amount substantially equal to the thickness of the plate material and then further bending a portion that positions at the lower direction toward the outside in the width direction. The rail 1a is formed to be longer than the vicinity of the concave portion 1b by approximately double in the front and back direction as well as extending and protruding in the front direction.

The slide plate 3 is structured by pressing and bending a metal plate material. The medium portion of the slide plate 3 which positions at a medium including the center in the width direction is offset with respect to the base plate 1 in the upper direction to be in parallel and a flat surface. The portions that position outer than the medium portion in the width direction are first perpendicularly bent in the lower direction to form lower direction extending portions that extend in the lower direction for the thickness of the guide 2 in the upper and lower direction, respectively. Then, each of the outer rails 3a is formed by further bending a portion that positions at the lower direction to be in parallel to the medium portion.

By the medium portion and the lower direction extending portions formed by these bending processes, a left-and-right pair of corner portions that extend in the front and back direction is formed. Then, the guides 2 are respectively connected to the corner portions by an appropriate means such as an engagement, insert molding or the like. The corner portions and the outer rails 3a are formed to be longer than the medium portion by approximately double in the front and back direction as well as extending and protruding in the back direction. The guides 2 are formed by fluoroplastics or the like in order to give a good sliding property with respect to the rails 1a, for example.

The slide device for an electronic device 100 further includes a slide plate 5 (slide plate) and plates 6. The slide plate 5 includes a left-and-right pair of holding portions 5b holding a left-and-right pair of guides 4 (outer sandwiching portions) which slidably sandwich the left-and-right pair of outer rails 3a (outer edges) in the front and back direction, respectively. Each of the plates 6 includes a stopper 6a (intermediate housing position defining portion) that defines an intermediate housing position by limiting the maximum displacement of the slide plate 5 with respect to the slide plate 3 in the front direction by protruding outward in the width direction from the front end portion of the outer rail 3a. The guides 4 are formed by fluoroplastics or the like in order to give a good sliding property with respect to the outer rails 3a, for example.

The slide plate 5 is structured by pressing and bending a metal plate material which is longer in the width direction than in the front and back direction. A medium flat portion of the slide plate 5 which positions at a medium including the center in the width direction is offset with respect to the medium portion of the slide plate 3 to be in parallel and a flat surface.

The portions that position outer than the medium flat portion of the plate material in the width direction are first perpendicularly bent in the lower direction to form arm portions 5a, and then the portions that position further outer in the width direction are further bent in the outer of the width direction to be in parallel to the medium portion, respectively. Then, the outer portions are further bent in the lower direction, and then further bent in the inner of the width direction to form the holding portions 5b, respectively.

In addition, the slide device for an electronic device 100 further includes stoppers 3b (intermediate using position defining portions) that define an intermediate using position by limiting the maximum displacement of the slide plate 5 with respect to the slide plate 3 in the back direction by protruding outward in the width direction from the back end portions of the outer rails 3a, respectively.

Further, the slide device for an electronic device 100 includes stoppers 7 (housing position defining portions) that define a housing position of the slide plate 3 with respect to the base plate 1 by limiting the maximum displacement of the slide plate 3 in the front direction of the base plate 1 by protruding in the upper direction of the upper and lower direction at the front portion of the base plate 1. Similarly, the slide device for an electronic device 100 includes stoppers 8 (using position defining portions) that define a using position by limiting the maximum displacement of the slide plate 3 with respect to the base plate 1 in the back direction by protruding in the upper direction at the back portion of the base plate 1.

The stoppers 7 and 8 are formed by an elastic member having a cushioning function such as a rubber or the like. Each of the stoppers 7 and 8 is provided with a hole portion at the respective center formed by a tap. The stoppers 7 and 8 are fixed to the base plate 1 by inserting stopper pins 9 to the hole portions thereof and caulking, respectively.

This fixing operation is performed at a timing when the slide device for an electronic device 100 is attached to the electronic device 102. With this operation, the base plate 1 is also fixed to a body portion lower housing 11b of a body portion 11. Further, the slide plate 5 is fixed to a sub-body portion upper housing 12a of a sub-body portion 12 by caulking of pins, not shown in the drawings, with four hole portions at front, back, left and right provided at outer end portions of the medium flat portion of the slide plate 5 in the width direction in FIG. 1, respectively.

Figure 2:
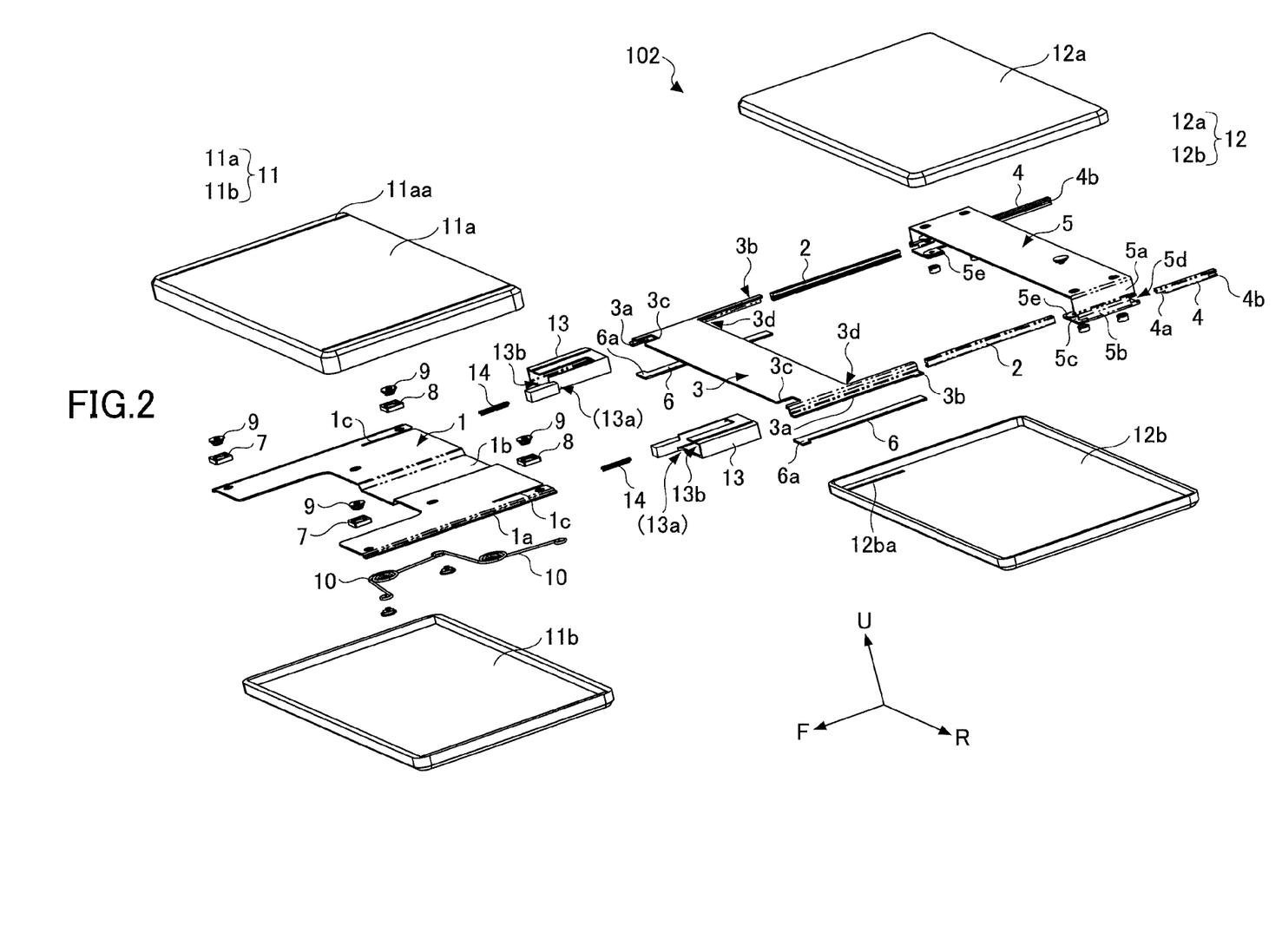
FIG. 2 is a schematic view showing main components of an electronic device including the slide device for an electronic device of the embodiment of the invention in an exploded state.

Here, the front direction of the front and back direction shown in FIG. 1 and FIG. 2 is a direction from the using position to the housing position, and a direction to oppose a user when the user is using the electronic device 102 including the slide device for an electronic device 100.

Further, as shown in FIG. 1, the front end portion of each of the guides 4 includes a front end housing portion 4a having a notched shape that houses the stopper 6a (intermediate housing position defining portion) by overlapping in the front and back direction at the above described intermediate housing position of the slide plate 5 with respect to the slide plate 3. In accordance with the front end housing portions 4a of the guides 4, the front end portion of the holding portions 5b include front end housing portion corresponding portions 5c having the notched shape similar to the front end housing portion 4a, respectively.

Similarly, the back end portion of each of the guides 4 includes a back end housing portion 4b that houses the stopper 3b (intermediate using position defining portion) by overlapping in the front and back direction at the intermediate using position of the slide plate 5 with respect to the slide plate 3. In accordance with the back end housing portions 4b of the guides 4, the back end portion the holding portions 5b include back end housing portion corresponding portions 5d having the notched shape similar to the back end housing portion 4b, respectively.

Further, as shown in FIG. 1, the front end portions at an extending portion extending in the width direction of the slide plate 3 are provided with front end accommodating portions 3c each having a notched square shape that accommodate the stoppers 7 each having a square columnar shape by overlapping in the front and back direction at the housing position, respectively.

Similarly, as shown in FIG. 2, the back end portion at an extending portion extending in the width direction of the slide plate 3 are provided with back end accommodating portions 3d each having a corner portion shape that accommodate the stoppers 8 each having a square columnar shape by overlapping in the front and back direction at the using position, respectively.

In this embodiment, each of the stoppers 6a is structured by the plate 6 which is the different part from the outer rails 3a. The sub-assembly shown in the left side in FIG. 1 is formed by bonding and fixing the plates 6 to a lower surface of the outer rails 3a by welding or the like, for example, after inserting the outer rails 3a of the slide plate 3 to the guides 4 of the slide plate 5 shown in FIG. 2 from a front direction side, respectively.

Then, the slide device for an electronic device 100 is assembled by inserting the rails 1a of the base plate 1 to the guides 2 of the sub-assembly from the front direction side, respectively. It means that an assembling operation can be simplified by preparing the plates 6 as separated members from the outer rails 3a.

Figure 3:
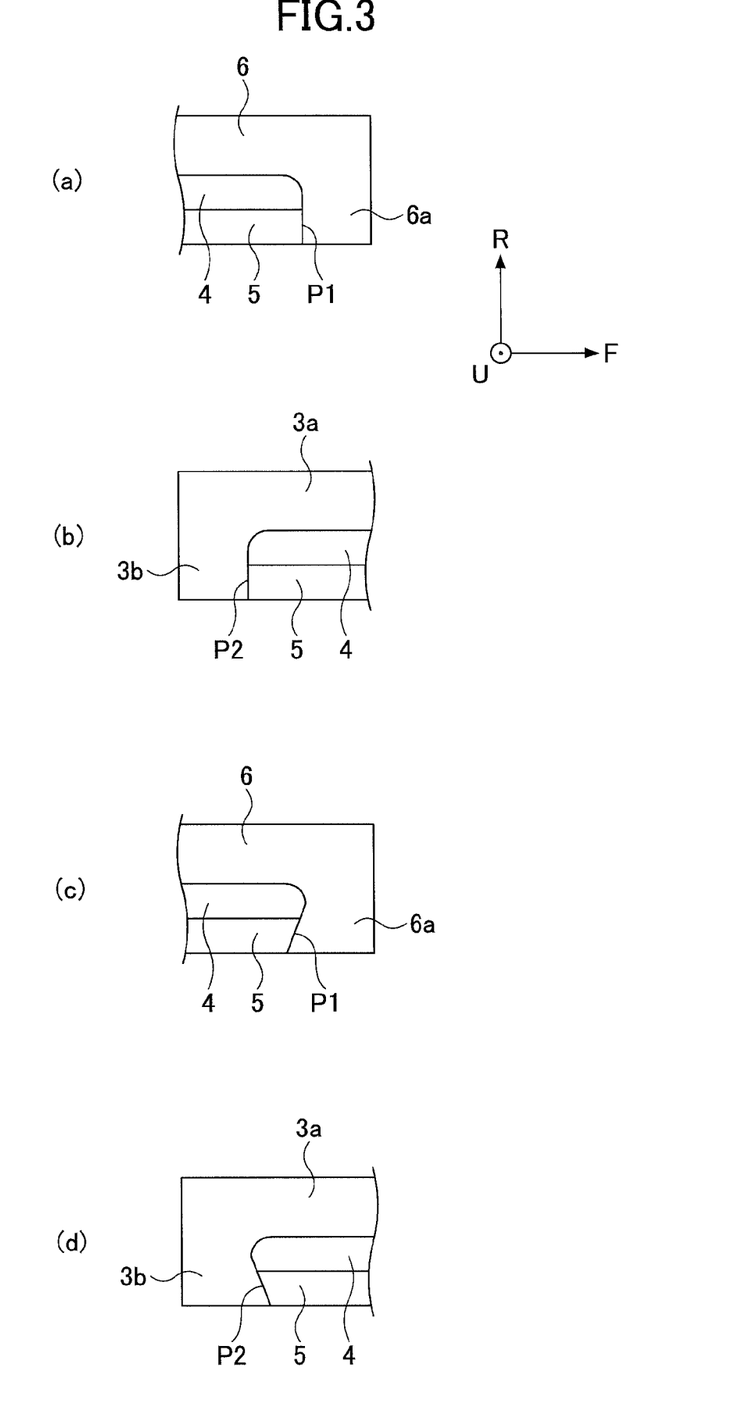
FIG. 3 is a schematic view showing an embodiment of a contacting surface of a stopper of the slide device for an electronic device of the embodiment of the invention as a cross-section perpendicular to an upper and lower direction.

In FIG. 3, (a) is a cross-section which is perpendicular to the upper and lower direction and includes a contacting surface P1 of the stopper 6a and the front end housing portion 4a and the front end housing portion corresponding portion 5c in the front and back direction at the intermediate housing position in which the slide plate 5 is slid for the maximum displacement in the front direction with respect to the slide plate 3 in FIG. 1. As shown in (a) of FIG. 3, the contacting surface P1 is perpendicular to the front and back direction except a foot, which has an R shape, of the stopper 6a that protrudes in the width direction from the plate 6.

Similarly, in FIG. 3, (b) is a cross-section which is perpendicular to the upper and lower direction and includes a contacting surface P2 of the stopper 3b and the back end housing portion 4b and the back end housing portion corresponding portion 5d in the front and back direction at the intermediate using position in which the slide plate 5 is slid for the maximum displacement in the back direction with respect to the slide plate 3. As shown in (b) of FIG. 3, the contacting surface P2 is perpendicular to the front and back direction except a foot, which has an R shape, of the stopper 3b that protrudes in the width direction from the outer rail 3a. In FIG. 3, although (a) and (b) show the contacting surfaces of the components at the left side when seen from the front direction as an example, the components at the right side have the same structures.

The slide device for an electronic device 100 of the embodiment includes springs 10 (energizing unit) each of which connects a protruding portion 5e shown in FIG. 2 that protrudes from the front portion of the holding portion 5b of the slide plate 5 in the inner width direction, and the slide plate 5.

As shown in FIG. 2, the slide device for an electronic device 100 of the embodiment is included in the electronic device 102. The electronic device 102 includes the body portion 11 which is fixed to the base plate 1, and the sub-body portion 12 which is fixed to the slide plate 5. The body portion 11 includes a body portion upper housing 11a and the body portion lower housing 11b where the body portion lower housing 11b is fixed to the base plate 1, as described above.

An internal space of the body portion 11 formed by the body portion upper housing 11a and the body portion lower housing 11b includes a space necessary for sliding the slide plate 3 in the front and back direction. The body portion upper housing 11a is provided with left-and-right pair of slits 11aa at an upper side surface through which the arm portions 5a of the slide plate 5 are slidably inserted, respectively. Similarly, a sub-body portion lower housing 12b is provided with left-and-right pair of slits 12ba at a lower side surface through which the arm portions 5a of the slide plate 5 are slidably inserted, respectively.

Figure 4:
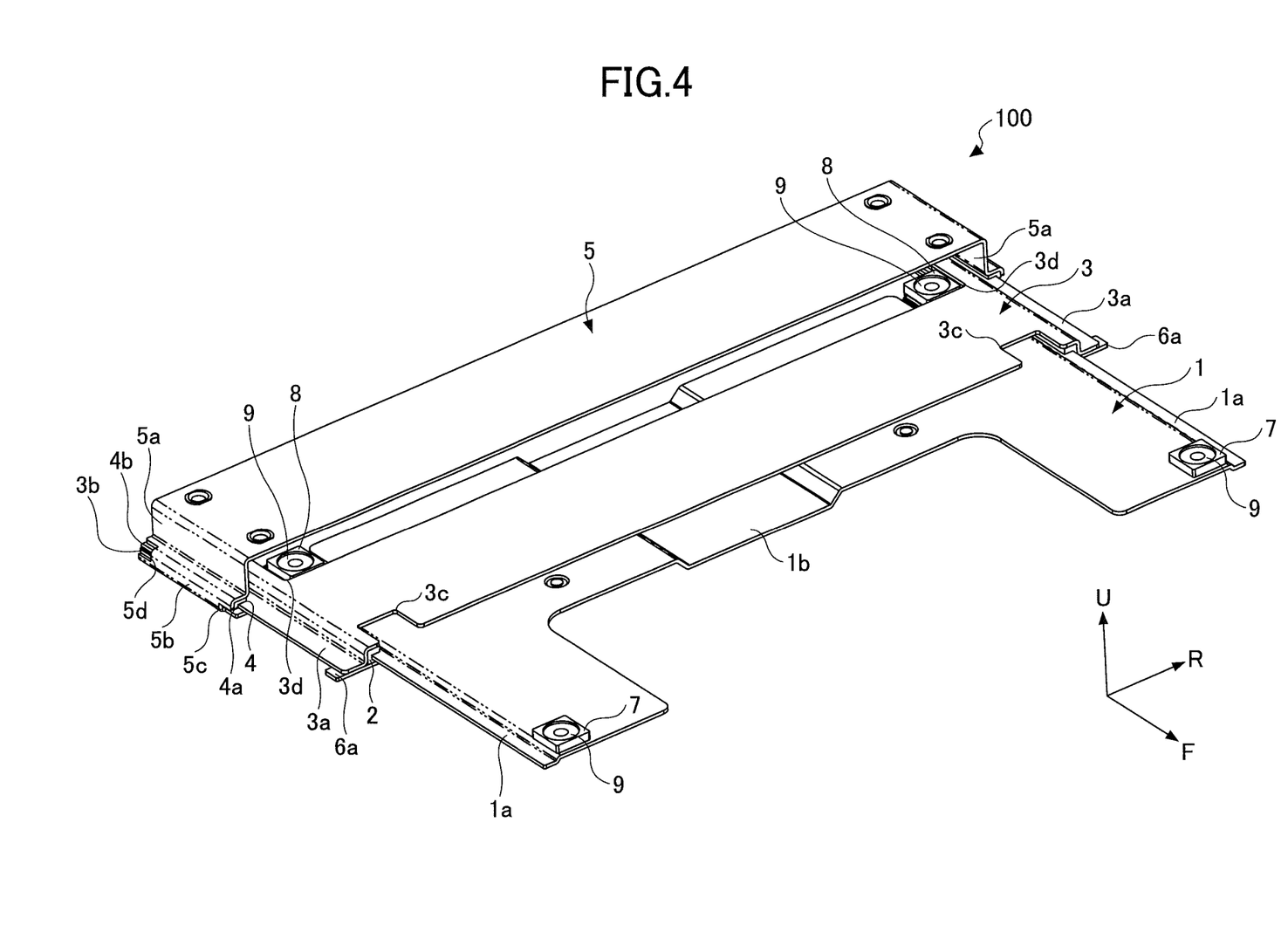
FIG. 4 is a schematic view showing an embodiment of an assembled slide device for an electronic device of the embodiment of the invention when a slide plate is slid in a front direction to be in a closed state, as seen from an oblique upper direction.
Figure 5:
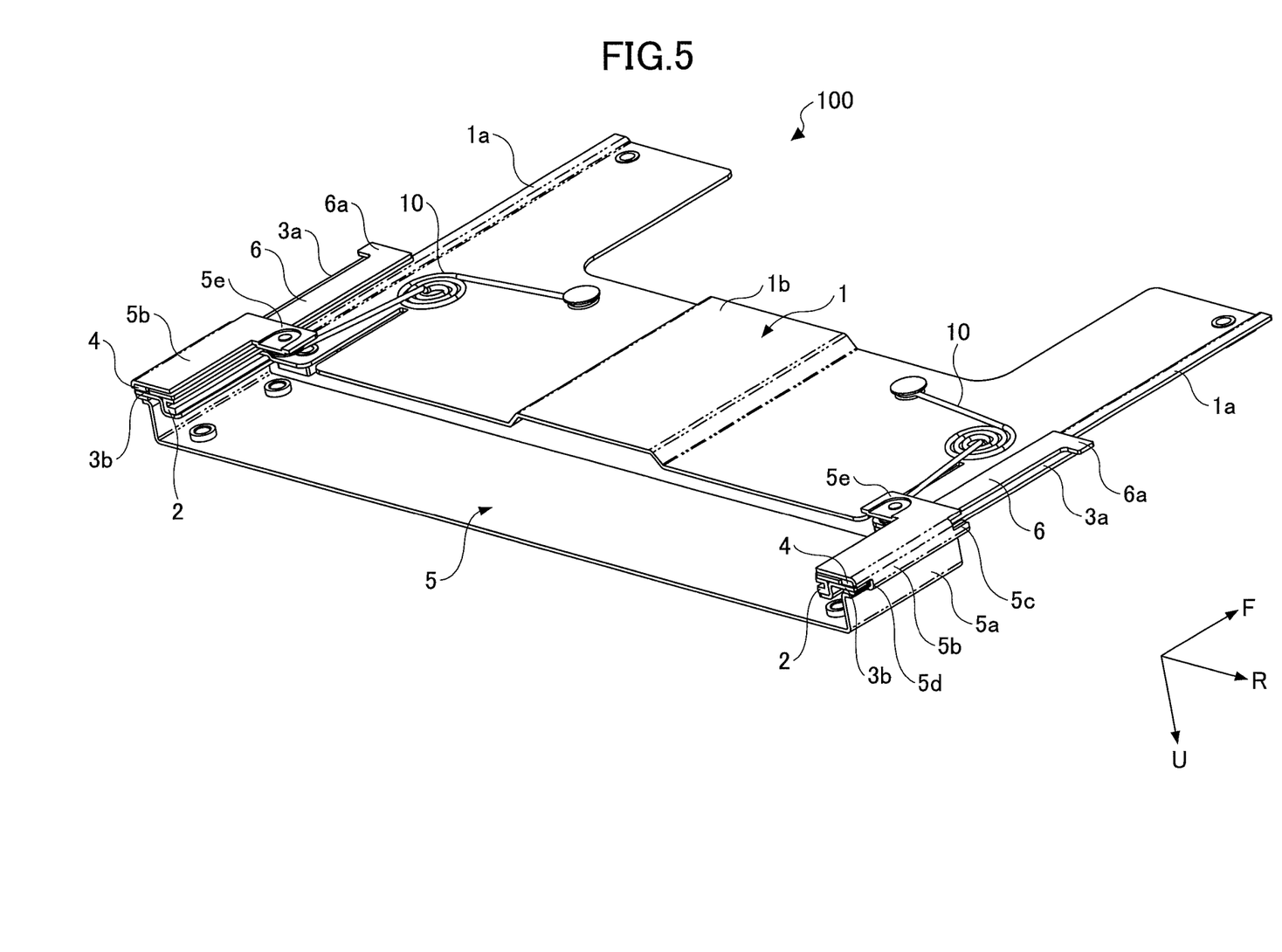
FIG. 5 is a schematic view showing an embodiment of the assembled slide device for an electronic device of the embodiment of the invention when the slide plate is slid in the front direction to be in the closed state, as seen from an oblique upper direction.
Figure 6:
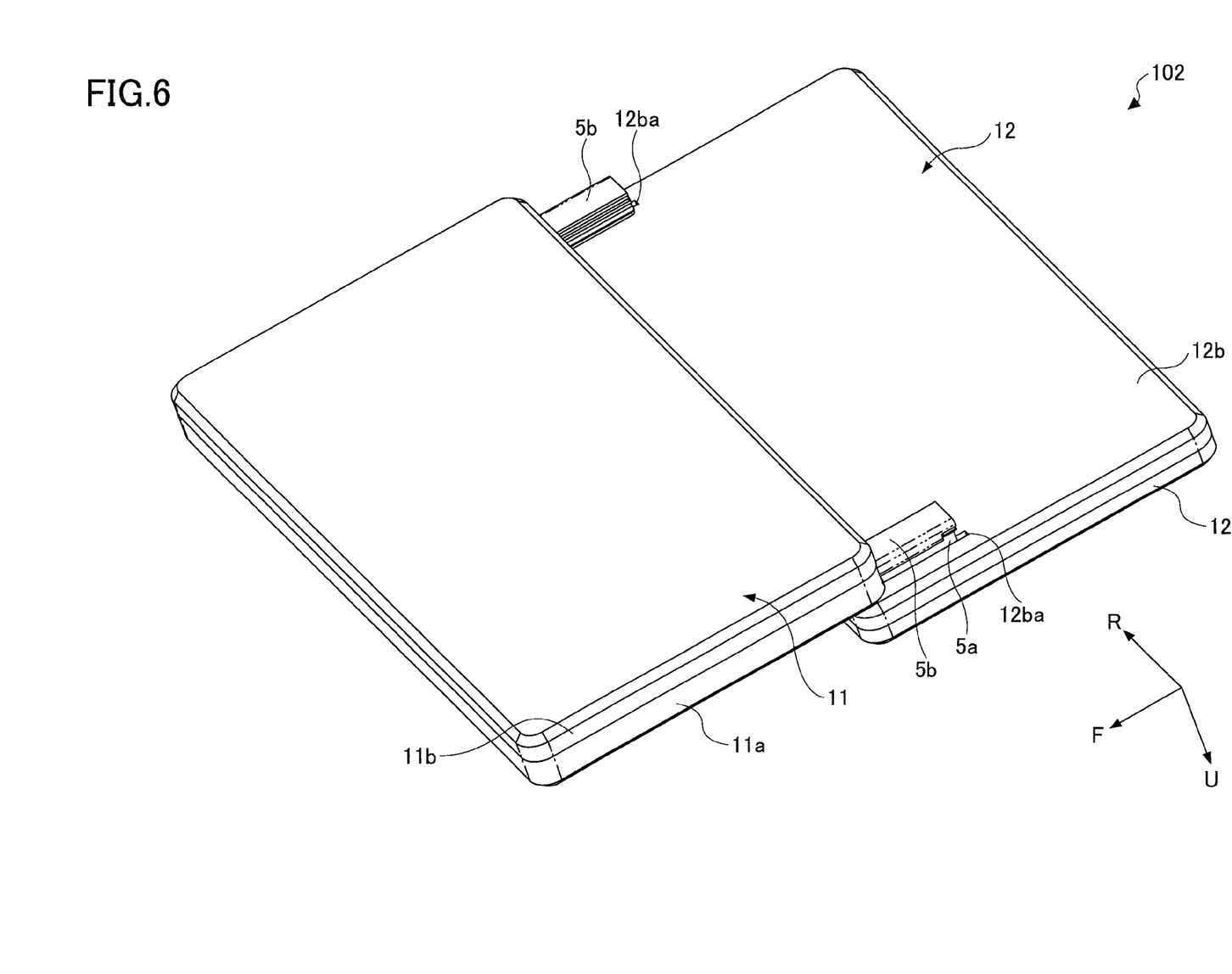
FIG. 6 is a schematic view showing the electronic device including the slide device for an electronic device of the embodiment of the invention at a status where covers are removed, as seen from an oblique lower direction.

Here, as shown in FIG. 4 and FIG. 5, when the slide plate 5 is slid to a position which is the furthest from the base plate 1 in the back direction, the portions of the slide plate 5 and the slide plate 3 at the back direction are exposed from the body portion 11 in the back direction, as shown in FIG. 6. Thus, in this embodiment, as shown in FIG. 7 and FIG. 2, a left-and-right pair of covers 13 is provided.

Figure 7:
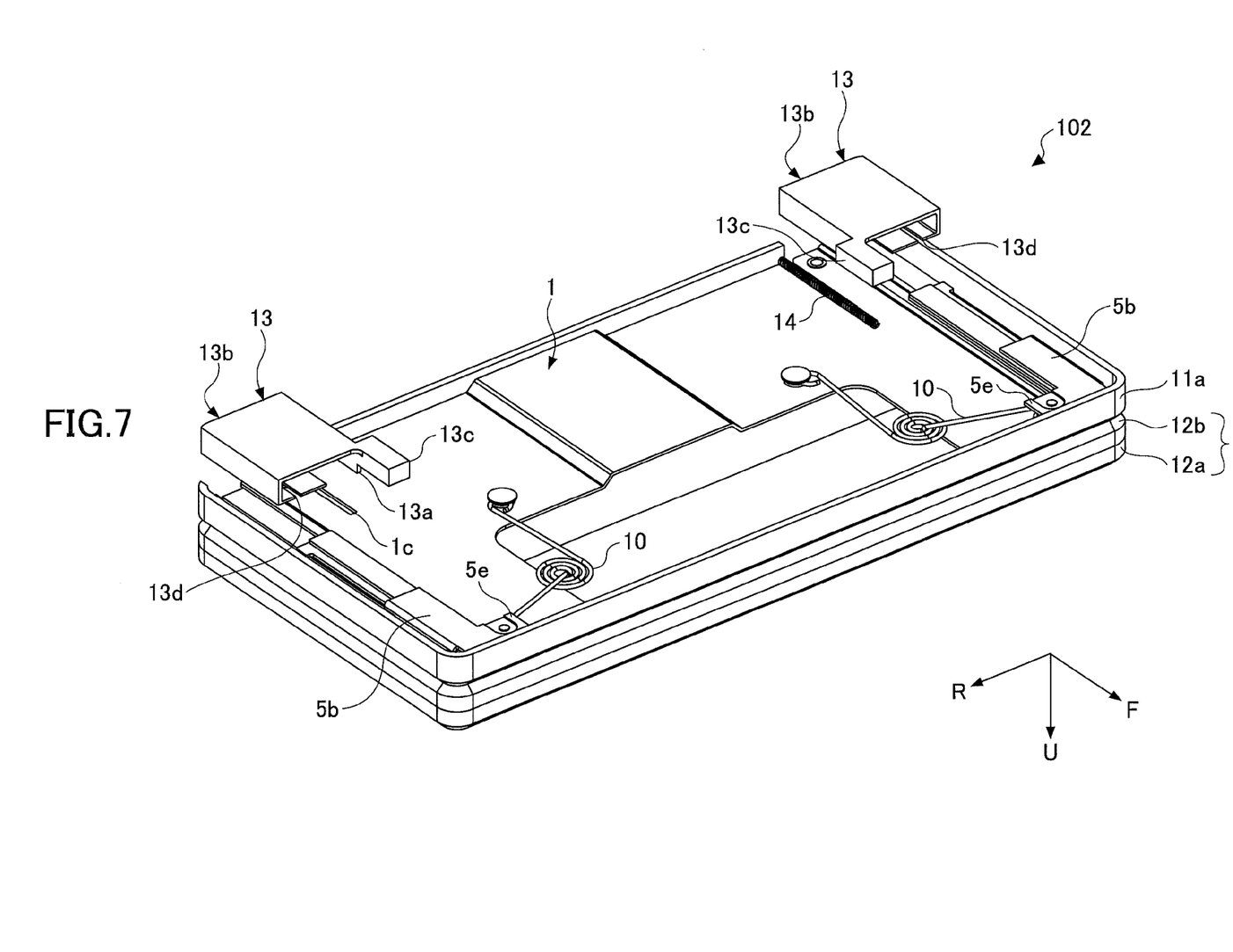
FIG. 7 is a schematic view showing an embodiment of an engagement of the covers to a base plate of the electronic device including the slide device for an electronic device of the embodiment of the invention at a status where the body portion lower housing is removed, as seen from the lower direction.

As shown in FIG. 7, the cover 13 is configured to be a cover unit that covers the portion of the slide plate 5 and the slide plate 3 exposed at the back direction of the body portion 11. The left-and-right pair of covers 13 is axisymmetric with respect to a center in the width direction with each other, each having a substantially box shape that opens in the front direction, and including an protruding engaging portion 13a that slidably engages a slit 1c (notch portion) which is provided at the base plate 1 to be extended in the front and back direction. Further, the cover 13 includes a cover spring 14 (applying energizing unit) that pushes the cover 13 in the front direction of the front and back direction.

Further, the cover 13 has the back end of the slide plate 5 (a surface to be contacted 13b to contact the holding portion 5b) as a bottom surface of the box at the back direction side when the slide plate 5 is moved in the back direction of the front and back direction, and includes a box 13c (outer enveloping portion) that envelopes and holds the cover spring 14 to be extended in the front direction and the inner width direction from the box shaped body portion.

The front side end of the cover spring 14 is limited by the front side end surface of the box 13c (outer enveloping portion) in the back direction. The back side end of the cover spring 14 is limited by the inner wall surface at the back side of the body portion lower housing 11b. Thus, the cover spring 14 always pushes the cover 13 in the front direction.

Figure 8:
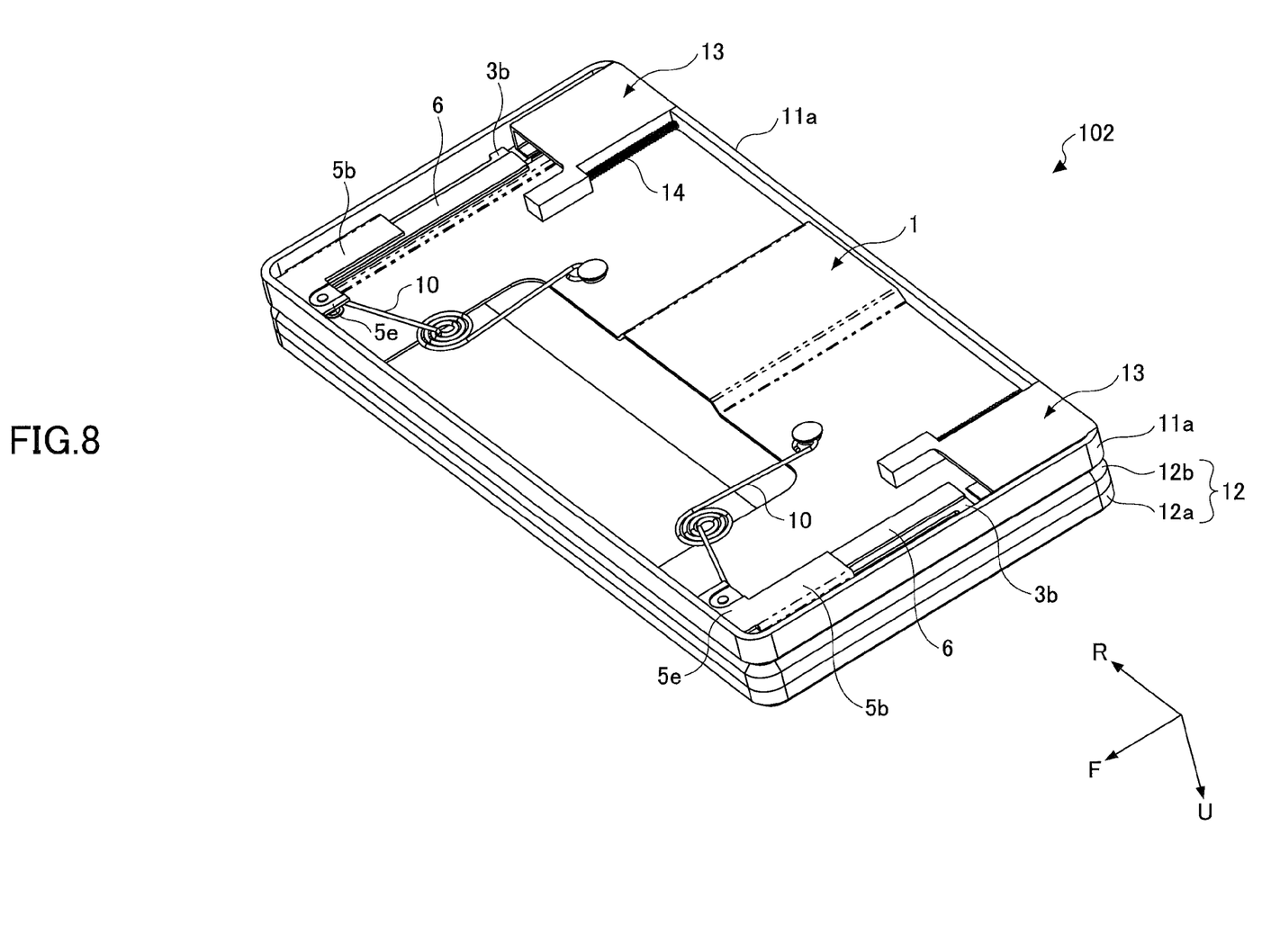
FIG. 8 is a schematic view showing an embodiment of the operation of the covers at the closed state of the electronic device including the slide device for an electronic device of the embodiment of the invention at the status where the body portion lower housing is removed, as seen from the lower direction.

Here, the position of the slit 1c at an end in the front direction of the front and back direction is configured such that the back end portion of the cover 13 and the back end portion of the body portion 12 match at the same plane when the end in the front direction of the engaging portion 13a is contacted, as shown in FIG. 8. In other words, the length of the engaging portion 13a in the front and back direction, the length of the slit 1c (notch portion) in the front and back direction, and the length of the cover 13 except the box 13c (outer enveloping portion) in the front and back direction are formed to be the same.

Figure 9:
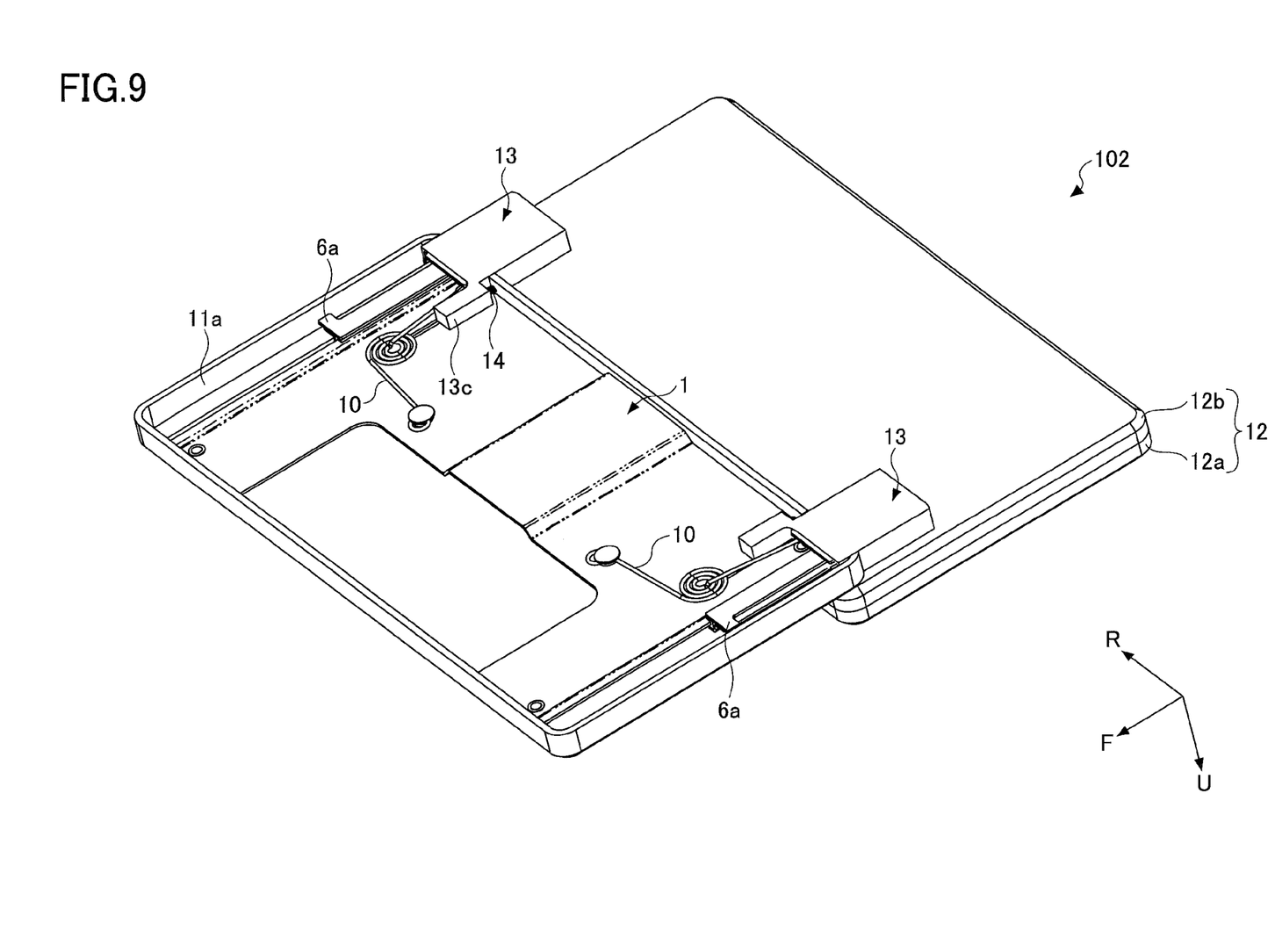
FIG. 9 is a schematic view showing an embodiment of the operation of the covers at an open state of the electronic device including the slide device for an electronic device of the embodiment of the invention at the status where the body portion lower housing is removed, as seen from the lower direction.
Figure 10:
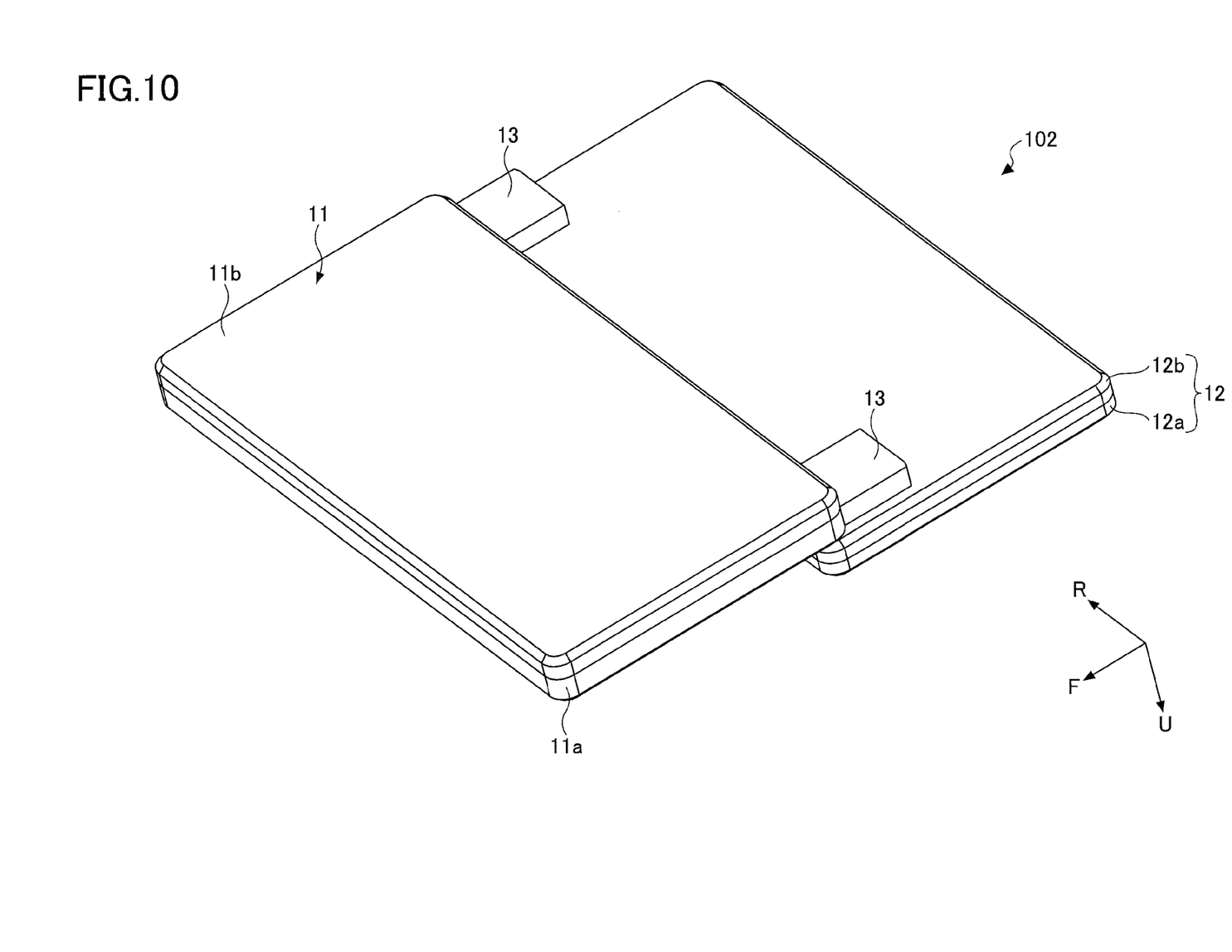
FIG. 10 is a schematic view showing an embodiment of the operation of the covers at the open state of the electronic device including the slide device for an electronic device of the embodiment of the invention, as seen from the lower direction.

Accordingly, when the sub-body portion 12 is slid in the back direction with respect to the body portion 11 in the electronic device 102, the covers 13 are protruded from opening portions at a wall surface in the back direction of the body portion lower housing 11b by the back end in the back direction of the slide plate 5, from the status shown in FIG. 8 to the status shown in FIG. 9 and FIG. 10. When the sub-body portion 12 is slid in the front direction, the sub-body portion 12 is housed in the body portion lower housing 11b again by the pushing force of the cover spring 14, as shown in FIG. 8.

Figure 11:
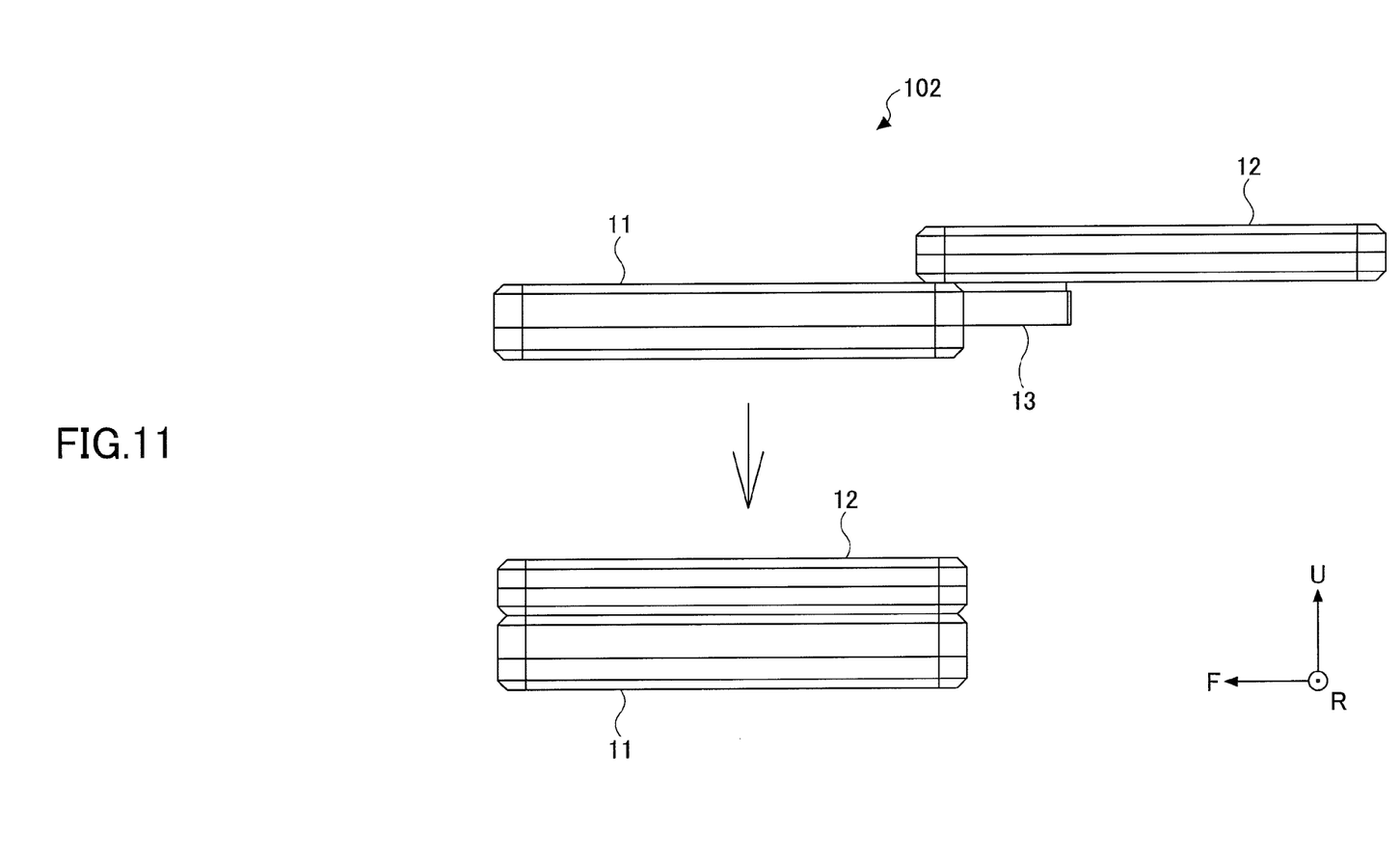
FIG. 11 is a schematic view showing an embodiment of the operation of the covers at the open, and closed states of the electronic device including the slide device for an electronic device of the embodiment of the invention, as seen from the right direction.

According to the above described slide device for an electronic device 100 and the electronic device 102 including the slide device for an electronic device 100 of the embodiment, the following merits can be obtained. In the slide device for an electronic device 100, the overlapping amount of the base plate 1 and the slide plate 5 in the front and back direction can be made as small as possible when the slide plate 5 is moved with respect to the base plate 1 in the back direction of the front and back direction for the maximum amount, as shown in FIG. 11.

With this, in the electronic device 102, the convenience for users can be increased by enlarging an area of the body portion 11 which is exposed when the sub-body portion 12 is moved for the maximum amount in the back direction with respect to the body portion 11. Especially, when the input device such as the numeric keypad, the small keyboard or the like is provided at the exposed surface, the individual keys can be made as large as possible, limitation for the alignment of keys can be made small as possible to ensure the high convenience of the users.

In addition, both the overlapping amount of the rails 1a and the guides 2 in the front and back direction, and the overlapping amount of the outer rails 3a and the guides 4 in the front and back direction, can be made larger. With this, the relative displacement and relative rotation of the sub-body portion 12 with respect to the body portion 11 in the electronic device 102 can be suppressed as much as possible.

In this embodiment, the slide plate 3 can be made thin in the upper and lower direction by forming the rails 1a and the outer rails 3a to be in the same plane. Thus, the space necessary for the slide plate 3 to be moved in the body portion 11 can be as small as possible. This means that the convenience of the users can be increased while decreasing the size of the entirety of the electronic device 102.

In this embodiment, the overlapping amount of the rails 1a and the guides 2 in the front and back direction and the overlapping amount of the outer rails 3a and the guides 4 in the front and back direction can be ensured. At the same time, by forming the stoppers 6a and the stoppers 3b to protrude in the outer width direction while forming the stoppers 7 and 8 to protrude in the upper direction, which is perpendicular from each other, the following merits can be obtained.

According to the structure of the stoppers of the embodiment, when the slide plate 5 is relatively rotated with respect to the base plate 1 while having a center in the upper and lower direction or the width direction in accordance with the operation of the sub-body portion 12, the stoppers 7 or the stoppers 8 can contact the front end accommodating portions 3c or the back end accommodating portions 3d of the slide plate 3 for the relative rotation having the center in the front and back direction. On the other hand, the stoppers 6a or the stoppers 3b can contact the front end housing portion 4a of the guide 4 and the front end housing portion corresponding portion 5c of the slide plate 5, or the back end housing portion 4b and the back end housing portion corresponding portion 5d, respectively, for the relative rotation having the center in the width direction.

Thus, by setting the combination of protruding directions of the components originally included in the electronic device 102 and the slide device for an electronic device 100, the number of interference portions between the components can be increased to increase the restraint, in addition to the original interference between the rails 1a and the guides 2 and the outer rails 3a and the guides 4. Then, the relative rotation can be suppressed as much as possible in a direction which may become a problem when a user uses the electronic device 102. With this, the above described relative rotation of the sub-body portion 12 fixed to the slide plate 5 is suppressed to increase operativity.

Further, by providing the above described covers 13, the internal mechanisms of the slide device for an electronic device 100 are prohibited from being exposed outside when the sub-body portion 12 is slid in the back direction to increase salability. In this embodiment, as the base plate 1 includes the concave portion 1b that concaves in the lower direction, the disposition and design of the wiring members for electrically connecting the body portion 11 and the sub-body portion 12 can be simplified.

Although the present invention is described with specific examples, the present invention is not limited to the specifically disclosed embodiments, and variations and modifications may be made without departing from the scope of the present invention.

For example, in the above embodiment, as shown in (a) and (b) of FIG. 3, the contacting surfaces P1 and P2 are formed to be perpendicular to the front and back direction. However, the embodiments shown in (c) and (d) of FIG. 3 may be adopted. In FIG. 3, (c) is a cross-section which is perpendicular to the upper and lower direction and includes the contacting surface P1 of the stopper 6a and the front end housing portion 4a and the front end housing portion corresponding portion 5c in the front and back direction at the intermediate housing position. It means that the contacting surfaces P1 which exist as the left-and-right pair are formed to be bilaterally inclined in the front and back direction while having the center in the width direction except feet, each of which has an R shape, of the stoppers 6a that protrude in the width direction from the plates 6, respectively, so that normal lines thereof direct in the backward and the inner width directions as shown in (c) of FIG. 3.

Similarly, in FIG. 3, (d) is a cross-section which is perpendicular to the upper and lower direction and includes the contacting surface P2 of the stopper 3b and the back end housing portion 4b and the back end housing portion corresponding portion 5d in the front and back direction at the intermediate using position. It means that the contacting surfaces P2 which exist as the left-and-right pair are formed to be bilaterally inclined in the front and back direction while having the center in the width direction except feet, each of which has an R shape, of the stoppers 3b that protrude in the width direction from the outer rail 3a, respectively, so that normal lines thereof direct in the forward and the outer width directions as shown in (d) of FIG. 3.

According to the contacting surfaces P1 and P2 of the embodiment, components in the width direction can be added to the force applied to the left-and-right pair of the contacting surfaces. Thus, the rotation of the sub-body portion 12 with respect to the body portion 11 having the front and back direction as the center, or the relative displacement in the width direction can be suppressed as much as possible. This suppression can occur especially when a moment having the front and back direction as the center or the force in the width direction is applied to the sub-body portion 12.

The present invention is not limited to the specifically disclosed embodiments, and variations and modifications may be made without departing from the scope of the present invention.

The present application is based on Japanese Priority Application No. 2010-136343 filed on Jun. 15, 2010, the entire contents of which are hereby incorporated by reference.

Industrial Applicability

The slide device for an electronic device of the invention can be preferably used for various electronic devices including a sub-body portion capable of moving in a direction with respect to a body portion as it is possible to increase salability by compatibly combining convenience and operativity.

What is claimed is:

1. A slide device for an electronic device comprising:

a substrate including a pair of side edges;

an intermediate plate including
a pair of sandwiching portions slidably sandwiching the pair of side edges in the front and back direction, respectively, and
a pair of outer edges at outer sides of the side edges in the width direction, respectively;

a slide plate including a pair of outer sandwiching portions slidably sandwiching the pair of outer edges in the front and back direction, respectively;

an intermediate housing position defining portion that protrudes to an outer side in the width direction from the front end portion of one of the pair of outer edges for defining an intermediate housing position of the slide plate with respect to the intermediate plate;

an intermediate using position defining portion that protrudes to the outer side in the width direction from the back end portion of one of the pair of outer edges for defining an intermediate using position of the slide plate with respect to the intermediate plate;

a housing position defining portion that protrudes in an upper direction of an upper and lower direction at a front portion of the substrate for defining a housing position of the intermediate plate with respect to the substrate; and a using position defining portion that protrudes in the upper direction at a back portion of the substrate for defining a using position of the intermediate plate with respect to the substrate.

2. The slide device for an electronic device according to claim 1, wherein a front direction of the front and back direction is a direction toward the housing position from the using position.

3. The slide device for an electronic device according to claim 2, wherein the front end portion of the outer sandwiching portion includes a front end housing portion that houses the intermediate housing position defining portion at the intermediate housing position.

4. The slide device for an electronic device according to claim 3, wherein the back end portion of the outer sandwiching portion includes a back end housing portion that houses the intermediate using position defining portion at the intermediate using position.

5. The slide device for an electronic device according to claim 4, wherein the front end portion of the intermediate plate includes a front end accommodating portion that accommodates the housing position defining portion at the housing position.

6. The slide device for an electronic device according to claim 5, wherein the back end portion of the intermediate plate includes a back end accommodating portion that accommodates the using position defining portion at the using position.

7. The slide device for an electronic device according to claim 1, further comprising:
   a body portion fixed to the substrate;
   a sub-body portion fixed to the slide plate;
   a cover unit that covers a portion of the slide plate and the intermediate plate which is exposed from the body portion, and includes an engaging portion which slidably engages a notch portion provided at the substrate to be extended in the front and back direction, and an applying energizing unit that energizes the cover unit toward the front direction of the front and back direction.

* * * * *